(12) United States Patent
Zauber et al.

(10) Patent No.: US 7,275,961 B2
(45) Date of Patent: *Oct. 2, 2007

(54) RUGGED, REMOVABLE, ELECTRONIC DEVICE

(75) Inventors: Vonn A. Zauber, DeSoto, TX (US); Steven M. Gentry, Burleson, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/365,729

(22) Filed: Mar. 1, 2006

(65) Prior Publication Data

US 2006/0264113 A1 Nov. 23, 2006

Related U.S. Application Data

(63) Continuation-in-part of application No. 10/951,155, filed on Sep. 28, 2004.

(51) Int. Cl.
*H01T 13/66* (2006.01)

(52) U.S. Cl. ............................................. 439/620.21

(58) Field of Classification Search ................ 439/654, 439/638, 710, 320, 937, 620, 620.21
See application file for complete search history.

(56) References Cited

U.S. PATENT DOCUMENTS

| 4,595,839 | A * | 6/1986 | Braun et al. ................. 250/551 |
| 5,197,895 | A * | 3/1993 | Stupecky .................... 439/194 |
| 6,466,437 | B1 * | 10/2002 | Sakuragi et al. ............ 361/686 |
| 6,916,210 | B2 * | 7/2005 | Moore et al. ............... 439/685 |
| 2002/0185533 | A1 * | 12/2002 | Shieh et al. ................. 235/441 |
| 2004/0038592 | A1 * | 2/2004 | Yang .......................... 439/638 |

* cited by examiner

*Primary Examiner*—Tulsidas C. Patel
*Assistant Examiner*—Phuongchi Nguyen
(74) *Attorney, Agent, or Firm*—Williams, Morgan & Amerson, P.C.

(57) ABSTRACT

An apparatus is disclosed, including a rugged electrical connector supporting an external bus protocol including a power signal; a backshell canister mated to the electrical connector; an active electronic component housed in the canister; and an electrical connection between the active electronic component and the rugged electrical connector.

25 Claims, 4 Drawing Sheets

RUGGED, REMOVABLE, ELECTRONIC DEVICE

This application is a continuation in part of co-pending U.S. application Ser. No. 10/951,155, entitled "Rugged, Removable, Electronic Device", filed Sep. 28, 2004, in the name of the inventor Vonn A. Zauber and commonly assigned herewith.

BACKGROUND OF THE INVENTION

1. Field of the Invention

The present invention pertains to electronic devices for use in harsh, demanding environments.

2. Description of the Related Art

The application of computing technology continues to expand into ever harsher environments. At one time, computers and other computing devices were housed in separate, dedicated, climate controlled rooms. People wishing to use such machines would go to where they were located to interact with them. Considerable effort was made to cater to the environmental needs of the machines, even to the point of inconveniencing the users. Accordingly, not much concern was given to designing computers and computing devices to withstand the rigors of harsh environments.

Increasing demands on computing technology have changed all that. Today, computing devices are being deployed in ever harsher environments with one or more conditions such as extreme temperatures, high shock, high vibration, excessive humidity, and chemical exposure. For instance, computers are commonly found in oilfield applications where they are subjected to extremes of temperature, shock and vibration'. Computing technology has also found growing application in military applications, including weapons systems that are particularly high performance. Military applications, as well as some civilian applications, also add the additional pressure of life and death stakes as a function of performance level.

Much effort has therefore gone into "ruggedizing" computing technology. Sometimes this results in changes to the designs of the computing devices, connectors, buses, storage devices, etc. For instance, the design of a microprocessor might be changed to enable to withstand higher or lower temperatures found in a particular harsh environment. Sometimes the effort results in techniques for installing an existing design. For example, an existing microprocessor might be mounted in a way that helps isolate it from vibration. Cumulatively, these kinds of changes significantly impact the performance of computing technology in demanding environments.

One complicating factor is the reality that ruggedization is but one factor in the design of a computing apparatus. The engineering task usually involves a multitude of tradeoffs among competing considerations that will be implementation specific. Thus, a particular ruggedization technique may not be acceptable if it results in excessive size and weight for, e.g., a missile whereas it may be acceptable if used in, e.g., an armored ground vehicle. Thus, it is not enough that a particular ruggedization technique is available and will work, it must also not force unacceptable tradeoffs with other engineering constraints. Preferably, the ruggedization technique will actually facilitate or enhance the design's ability to meet other engineering constraints. However, even if it facilitates the design effort in multiple areas, it may still be unacceptable if it undesirably impacts the computational performance of computing apparatus.

Another complicating factor is that the computing apparatus as a whole must be ruggedized. It does little good to ruggedize the computing device (e.g., the processor or controller) if the storage is not. Storage is equally important in the performance of a computing apparatus since the computing device is dependent upon the storage for, among other things, the data on which it operates. This becomes more important as computing technologies are applied to more computationally intensive problems that process higher volumes of data that require greater storage. Furthermore, the electrical connection between the computing device and the storage is dependent upon the buses and connectors through which the electrical connection is made. The ruggedization of each of these aspects of the computing apparatus involves different considerations such that techniques applicable to, for example, the computing device, may not be applicable to, for instance, the connectors.

To illustrate the difficulties of balancing these factors, consider the relatively recent development of removable mass storage. To facilitate portability, the mass storage device should be small and lightweight. To facilitate interoperability, the mass storage device should be relatively platform independent, i.e., to be usable with a variety of platforms. It should provide stable connections, high numbers of accesses, and fast accesses. For present purposes, it should be able to withstand extremes of temperature, high shock, high vibration, and high humidity. It should also cost relatively little.

Some "ruggedized" Universal Serial Bus ("USB") flash drive, removable mass storage devices have been developed. These solutions are typically sufficiently small, light, and platform independent. Some have hardened packages for increased durability and, presumably, better tolerance for shock. However, they also employ the standard USB connector and interface. The standard USB interface is not suitable for military applications and for most harsh environments. Among other problems, the connectors are fragile and the connections they make are susceptible to failure in the face of high vibration and/or shock.

Some military solutions have been developed to address the deficiencies of these ruggedized USB flash drives. These solutions admirably address those deficiencies and are typically built on a removable flash card, such as a Compact Flash, Personal Computer Memory Card International Association ("PCMCIA"), etc. card. They generally include a host chassis with a removable cartridge assembly. However, they usually include a heavy internal power supply. They also tend to be bulky, large, expensive, and platform dependent.

The present invention is directed to resolving, or at least reducing, one or all of the problems mentioned above.

SUMMARY OF THE INVENTION

The invention includes an apparatus, comprising: a rugged electrical connector supporting an external bus protocol including a power signal; a backshell canister mated to the electrical connector; an active electronic component housed in the canister; and an electrical connection between the active electronic component and the rugged electrical connector.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1:
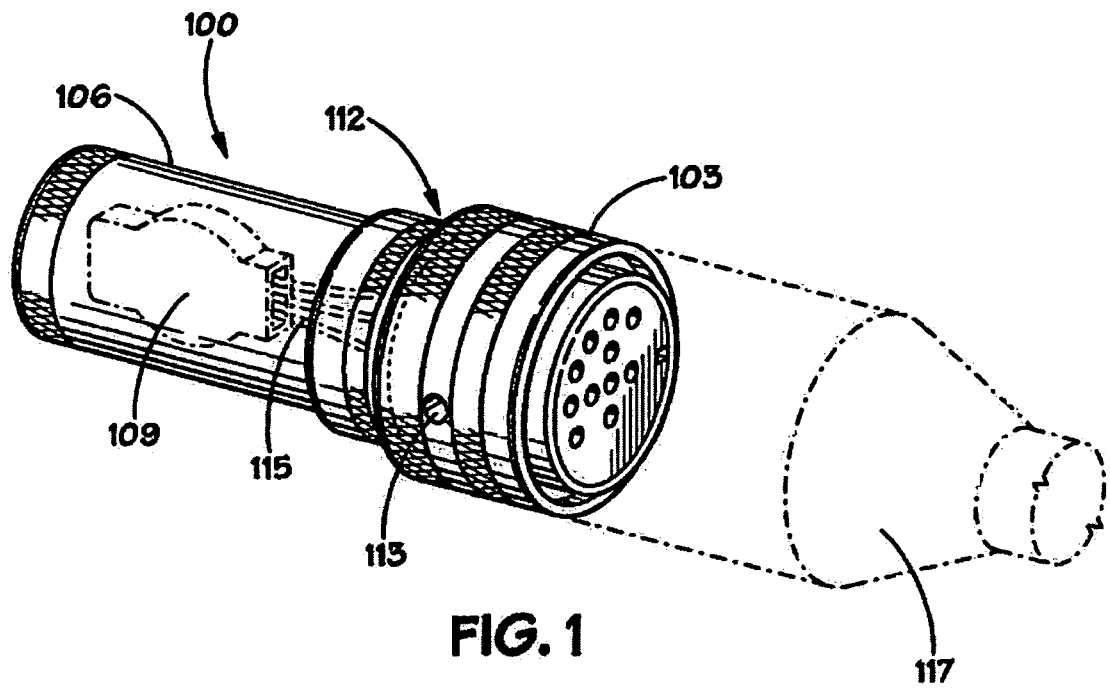
FIG. 1 is an assembled, perspective view of one particular embodiment of the present invention.
Figure 2:
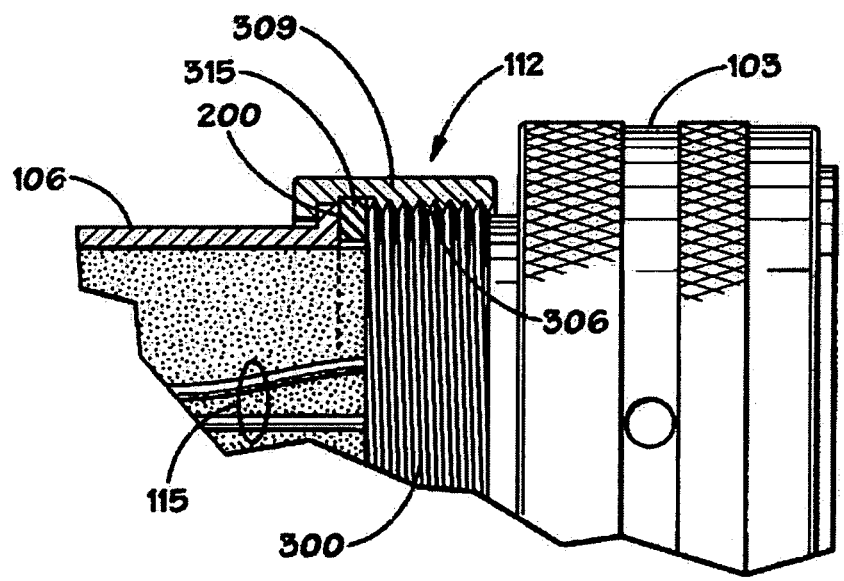
FIG. 2 is a partially sectioned, plan view of the embodiment in FIG. 1.
Figure 3:
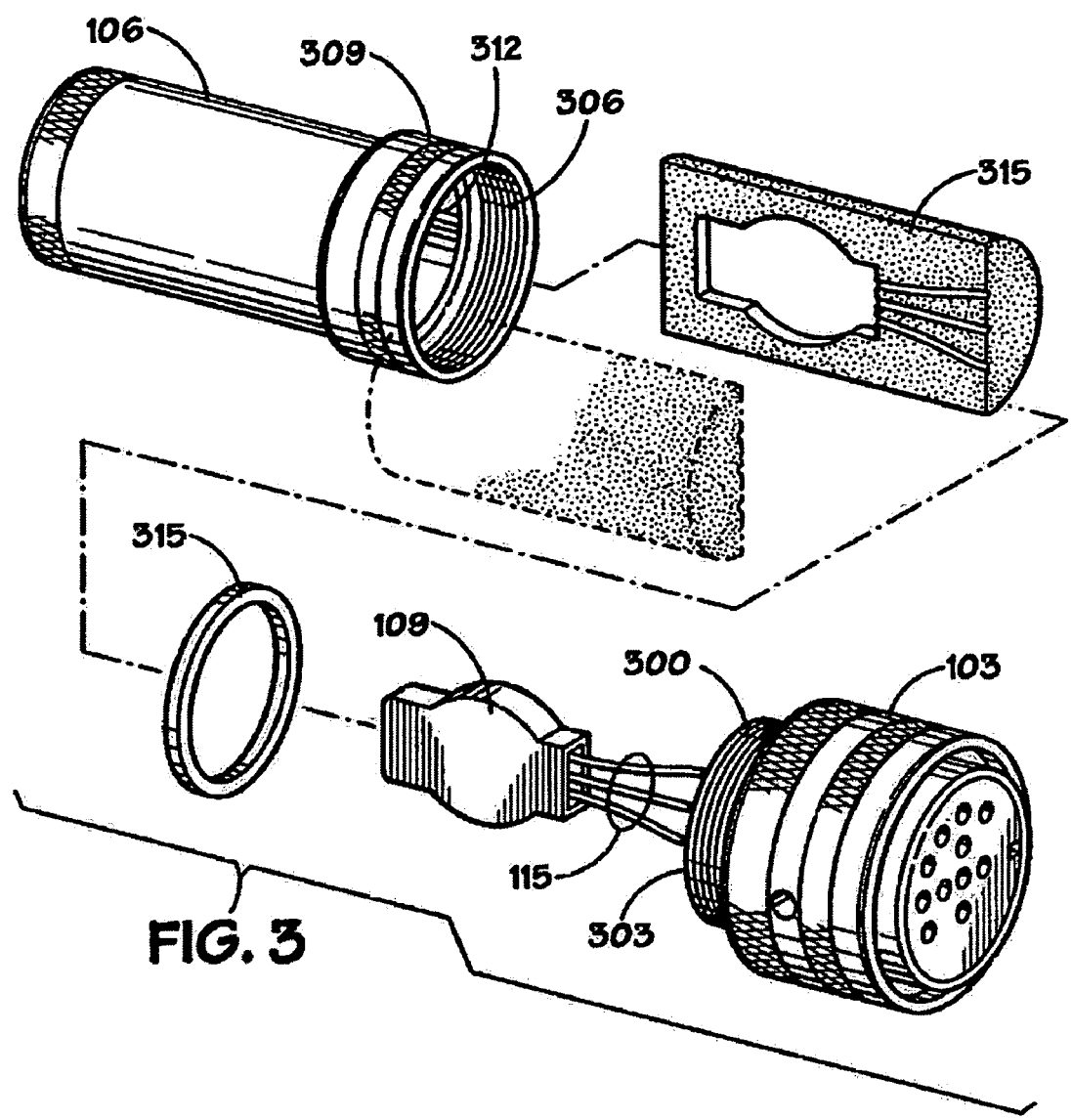
FIG. 3 is an exploded, perspective view of the embodiment of FIG. 1.

Turning now to the drawings, FIG. 1–FIG. 3 illustrate a first embodiment of a removable electronic apparatus 100 constructed in accordance with the present invention. The electronic apparatus 100 comprises a rugged electrical connector 103 supporting an external bus protocol including a power signal. A backshell canister 106 is mated to the rugged electrical connector 103. An active electronic component 109 electrically connected to the rugged electrical connector 103 is then housed in the backshell canister 106.

The rugged electrical connector 103 is sufficiently rugged to withstand elevated levels of shock, vibration, impact, etc. and consequently be resistant to damage by crushing, deformation, breakage, disassembly from vibration, etc., found in harsh, demanding environments. To some degree, the level of ruggedness will be implementation specific. Different levels of shock and vibration will be found, for instance, on the deck of drilling rig in hydrocarbon exploration and production than will be found on the floor of a machine shop. However, various military organizations routinely specify standards with respect to these kinds of conditions that are referred to as a "military specification," or "mil spec", and mil specs can be referred to where applicable, even in civilian contexts, although compliance with mil specs is not necessary to the practice of the invention. For instance, standards are also set b the American Society of Testing and Materials ("ASTM").

In the illustrated embodiment, the rugged electrical connector 103 is a cylindrical connector, and, more particularly, a circular connector. Suitable circular connectors are commercially available off the shelf from a number of vendors, such as Amphenol Aerospace, a division of:

Amphenol Corporation
358 Hall Avenue
Wallingford, Conn. 06492
USA
ph: (877) 267-4366
ph: (203) 265-8900
fax: (203) 265-8516
e-mail: aphinfo@amphenol.com
or, alternatively:
Glenair, Inc.
1211 Air Way
Glendale, Calif. 91201
USA
ph: (818) 247-6000
fax: (818) 500-9912

In general, circular connectors come in a bayonet-style or a threaded-style, and the illustrated embodiment is a bayonet-style circular connector. Thus, the apertures 113 (only one shown) that mate with ears (not shown) on the mating connector 117, shown in FIG. 1 in ghosted lines.

Other types of connectors might be employed in alternative embodiments.

The rugged electrical connector 103 of the illustrated embodiment also possesses a number of characteristics that, while not necessary to the practice of the invention, may be desirable in some embodiments. For instance, the rugged electrical connector 103 is environmentally resistant, e.g., waterproof, not susceptible to shock or vibration, etc. The rugged electrical connector 103 is also self-aligning, scoop-proof, and keyed. This particular embodiment furthermore is constructed to comply with the MIL Standard MS27467 (MIL-DTL 38999, Series I), promulgated by the United States Armed Forces. However, compliance with numerous other MIL standards and industrial standards may also be suitable in alternative embodiments.

As noted above, the cylindrical electrical connector supports an external bus protocol including a power signal. Exemplary external bus protocols include, but are not limited to, the Universal Serial Bus ("USB") protocol and the IEEE 1394 protocol (e.g., FireWire, etc.).

External bus protocols specify a number of characteristics, both physical and electrical, that a bus must meet to be compliant therewith. Note that the term "external bus protocol" is used as in the computing arts, e.g., to mean a bus that connects a computing device to a peripheral device. Note also that the USB and IEEE 1394 protocols are open standards, meaning they are available to the public. They have also achieved a wide acceptance such that their use in the present invention makes the apparatus 100 compatible with a wide array and number of computing devices.

The backshell canister 106 of the illustrated embodiment is also commercially available off the shelf, and typically from the same vendor from which the connector 103 is obtained. The backshell canister 106 in the illustrated embodiment is, like the rugged electrical connector 103, environmentally resistant. This particular embodiment furthermore is constructed to comply with the MIL Standard MS27467 (MIL-DTL-38999, Series I), promulgated by the United States Armed Forces. However, compliance with numerous other MIL standards and industrial standards may also be suitable in alternative embodiments.

The backshell canister 106 and the rugged electrical connector 103 are joined through a threaded connection 112, best shown in FIG. 2. As is shown best in FIG. 3, the rugged electrical connector 103 includes a male thread 300 on the outer circumference of a drum 303. The backshell canister 106 includes a female thread 306 on the inner circumference of a rotating ring 309 at the open end 312 of the backshell canister 106. The threaded connection 112 is formed by rotating one of the rugged electrical connector 103 and the backshell canister 106 is relative to the other in conventional fashion. In the illustrated embodiment, the rotating ring 309 is rotated onto the drum 303 to make the threaded connection 112. The outer surface of the rotating ring 309 is knurled or scored to improve the user's grip and thereby facilitate this function. The threaded connection 112 compresses an O-ring 315 between a shoulder 200 and an end of drum 303, best shown in FIG. 2, to make the threaded connection 112 watertight and airtight.

In various embodiments, the backshell canister 106 and/or outer portions of the electrical connector 103 may comprise materials such as aluminum, an aluminum alloy, a stainless steel, or the like and may be coated (e.g. anodized, etc) to inhibit corrosion and wear. Alternatively, the backshell canister 106 (or portions thereof) may comprise one or more of a radiopaque material, a translucent material, and a transparent material to facilitate communication between the active electronic component 109 and a computing device (not shown), as will be discussed in more detail below. The materials will be implementation specific and still other types of materials may be used in alternative embodiments.

The electronic component 109 is, in the illustrated embodiment, electrically connected to the rugged electrical connector 103 by a plurality of leads 115. The number of leads 115 will be a function of the external bus protocol supported by the electronic apparatus 100. Note that the electrical connection between the electronic component 109 may be implemented using techniques other than the leads 115. For instance, other embodiments might employ pins or finger edge connectors (e.g., gold-plated finger edge connectors), depending on the implementation of the active electronic component 109 and the rugged electrical connector 103.

In one particular embodiment, a rigid flex harness (not shown) is used to implement the electrical connection between the rugged electrical connector 103 and the active electronic component 109. A rigid flex harness permits control over impedances and have repeatability in terms of assembly. Two of protocols suitable for use in the present invention, USB 2.0 and Firewire, have high data rate potential and signal integrity can be tightly maintained by designing a rigid flex harness to pick up the back of the rugged electrical connector 103 and mate with whatever electronic assembly (i.e., the active electronic component 109) is inside the backshell canister 106.

The electronic component 109 is an active, as opposed to passive, electronic device. In the illustrated embodiment, the electronic component 109 is a memory device. In the illustrated embodiment, the memory device is commercially available off the shelf in the form of a USB flash drive. The electronic component 109 may be obtained by stripping away the shell and connector of a commercially available USB flash drive, leaving only the memory device that is then assembled into the present invention. Alternatively, the electronic device 109 may be obtained without the shell and connector, then assembled into the present invention.

Figure 4:
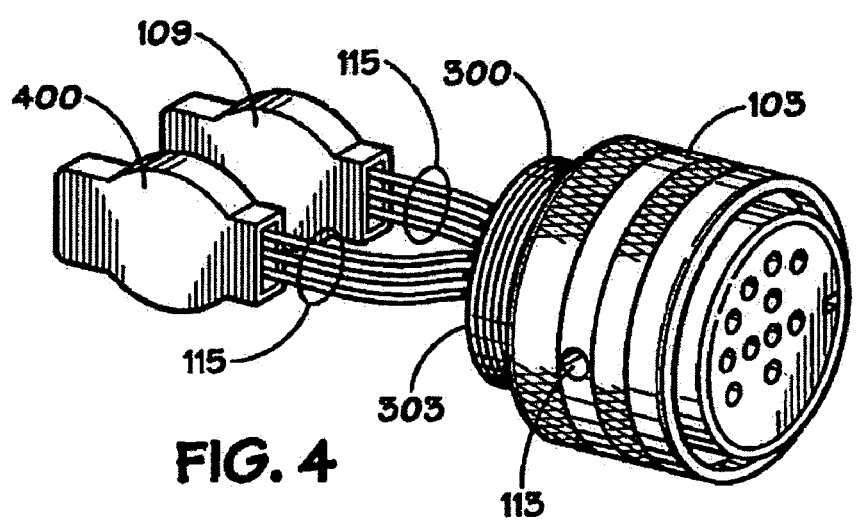
FIG. 4 is a partially disassembled, perspective view of a second embodiment in accordance with the present invention.

However, the invention is not limited to memory devices or even a single electronic device. Furthermore, as is shown in FIG. 4, alternative embodiments may employ a second electronic component 400 that may or may not be the same as the electronic component 109.

Thus, the active electronic component 109 may, in some embodiments, actually constitute and) 30 assembly of multiple electronic devices, at least one of which is an active.

The electronic component 109 can be, in some embodiments, a wirelessly transmitter, receiver, or transceiver permitting a wireless link between the apparatus (not shown) to which the apparatus 100 is too be connected and a remote location. For instance, the apparatus 100 may be equipped with a small antenna (not shown) and the backshell canister 106 made of some non-metallic material. In this way, a via an USB interface, a field device (such as a data logger) can establish a wireless Ethernet link to a field engineer with a commercial laptop, etc. Alternatively, an IrDA ("Infrared Data Association") standard connection, which is the standard that PDAs ("Personal Digital Assistants"), notebook computers, printers, etc. use to wirelessly link up, may be employed.

The backshell canister 106 in such embodiments may be constructed from a metal material provided an IR ("Infrared") window is provided; or, the whole backshell canister 106 may be made of an IR transparent material. For instance, Germanium (Ge) is commonly used for lenses and windows in IR systems operating in the 2–12 tm range and would be suitable for this application. The operational environment will not be problematical because Germanium is inert, mechanically rugged, and fairly hard. It is an excellent choice for multi-spectral systems and for applications where electromagnetic interference ("EMI") shielding is necessary. Germanium can also be electrically heated for anti-fogging or anti-icing applications.

The electronic component 109 is stabilized within the backshell canister 106 by a potting material 315, best shown in FIG. 3. The potting material 315 is, by way of example and illustration, but one means for stabilizing the electronic component 109. Other means may include, for instance, expanded foam or a brace. Some embodiments may omit means for stabilizing the electronic device altogether. When used, the choice of stabilizing means will be implementation specific. For instance, in the illustrated embodiment, the potting material 315 is selected to help transfer heat generated by the electronic component 109 is transferred away from the electronic component 109. However, in some harsh environments with extreme temperatures, this may be undesirable. Also, weight and size constraints may impact the choice of stabilizing means. Still other considerations may come into play in some embodiments.

In one particular embodiment, the removable electronic apparatus 100 is a "removable memory unit" meeting the requirements of both the mil standard MS27467 and the USB 2.0 standard. This particular embodiment provides a rugged memory unit offering USB 2.0 performance for the HIMARS Universal Launcher Interface Unit ("HULIU") of the M142 Launcher for the High Mobility Artillery Rocket System ("HIMARS") of the United States Military. Selected characteristics of this particular embodiment are set forth in Table 1.

TABLE 1

Selected Characteristics

| Characteristic | Parameter |
| --- | --- |
| Memory Capacity | 1 Gigabyte, other capacities possible |
| Read/Write Performance | 20 Mbyte/sec Read, 10 Mbyte/sec Write |
| Operating Temperature | −40 C.–+85 C. |
| High Reliability | 5,000,000 write/erase cycles |

Figure 5A:
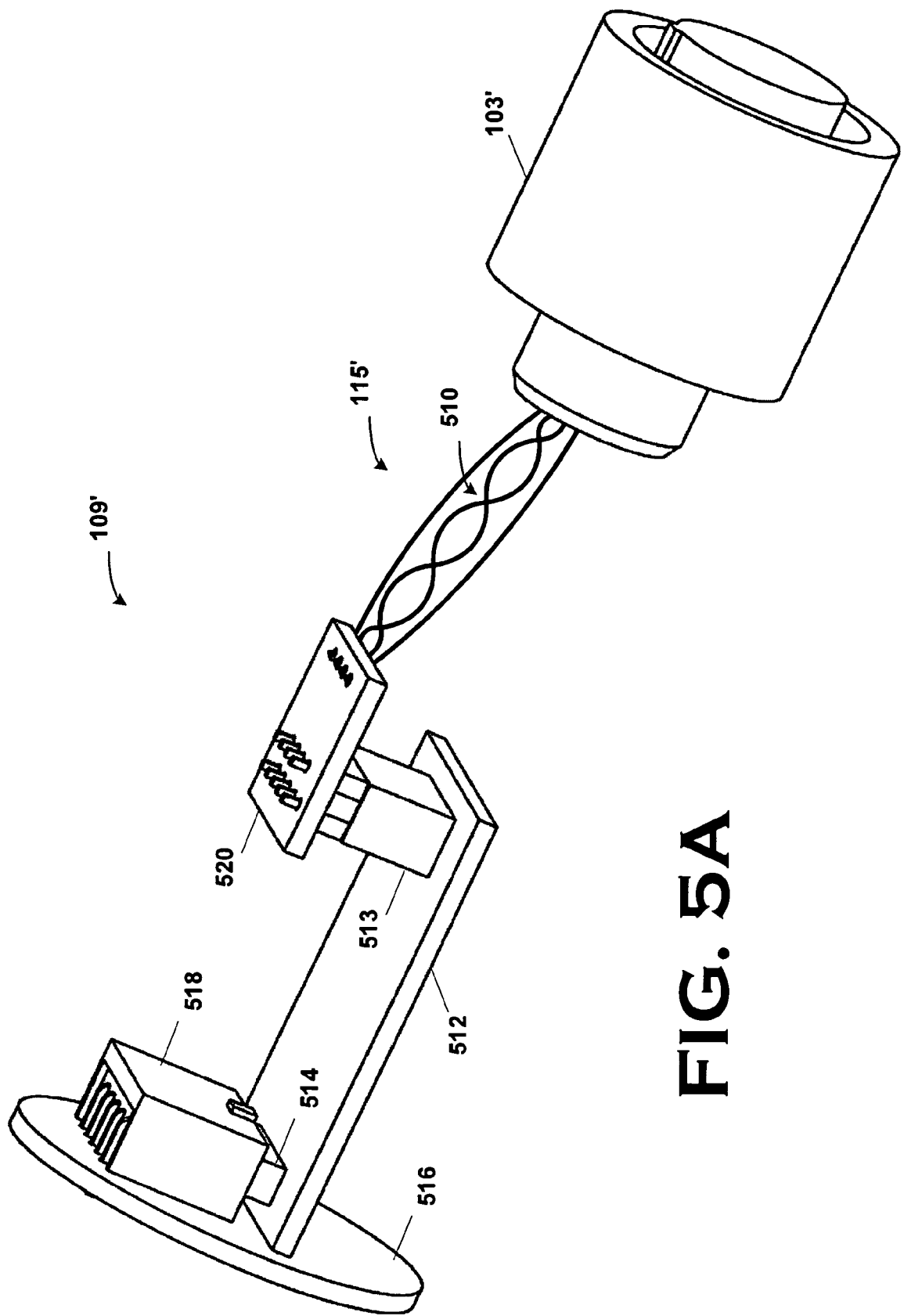
FIG. 5A–FIG. 5B illustrate one particular embodiment of the present invention.

Turning now to FIG. 5A, the electronic component 109' is an electronic assembly and is potted in an encapsulating material (not shown) Cytec EN-12. The Cytec EN-12 is a two-component, highly flexible liquid polyurethane molding and encapsulating systems commercially available under the mark CONATHANE® EN-12 from:

Cytec Industries Inc.
5 Garret Mountain Plaza
West Paterson, N.J. 07424
E-mail: INFO@CYTEC.COM
Phone: 973-357-3100.

Additional information is available from <http://www.conap.com/index.cfm?page=ElectList>. This particular material is submersion related and exhibits excellent shock absorption.

Figure 5B:
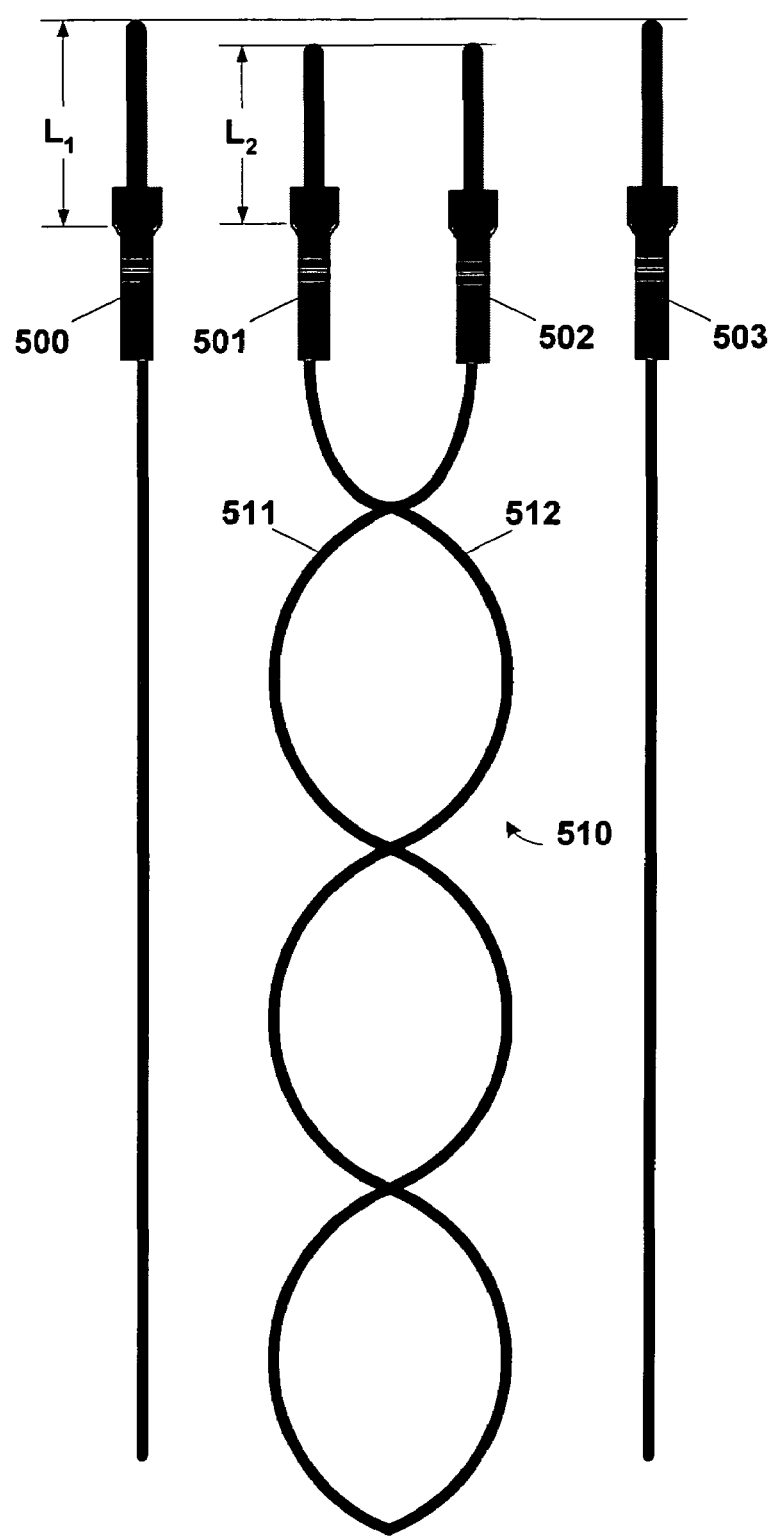

The connector 103' is a M27467T11B35P (MIL-C-38999 Series I) connector commercially available from ITT Cannon, among others. The connector 103' employ four pins 500–503, shown best in FIG. 5B, for four signals—namely, USB +5 V DC, USB 5 V Return, USB DP, and USB DN. Note that the signals are defined by the USB 2.0 standard, which is widely known and readily available from many sources. Table 2 contains a pinout for the connector 103' in this particular embodiment. Note, however, that alternative pinouts may be employed. The pins themselves are "22D" pins (also known as M39029/58-360 pins, or by their SAE designation AS39029/360), and may be implemented with Cannon P/N 030-2042-026 (Special) Short Contact Pins, as are commercially available. Note that the two pins 501, 502 are modified as described below.

TABLE 2

Pinout

| Pin # | Connection |
|---|---|
| 1 | N/C |
| 2 | USB +5 V DC |
| 3 | USB DP |
| 4 | USB DN |
| 5 | USB 5 V Return |
| 6 | N/C |
| 7 | N/C |
| 8 | N/C |
| 9 | N/C |
| 10 | N/C |
| 11 | N/C |
| 12 | N/C |
| 13 | N/C |

The connections between the pins 500, 503 carrying the USB +5 V DC and USB 5 V Return signals and the electronic component 109' can be made using any suitable technique. The connections between the electronic device 109' and the pins 501, 502 carrying the USB DP and USB DN signals are made by controlled impedance twisted pair cable 510. The twisted pair cable 510 comprises a 1031–216B cable partially encased in M23053/5-104 heat shrink sleeving (approximately 4–5 mm wide) approximately 15 mm from each end of the wire 511, 512 in a manner not shown. The 1031–216B cable is commercially and readily available from Thermax CDT. Further information may be obtained from <http://www.thermaxcdt.com/contact_us.asp>.

More particularly, the USB 2.0 standard specifies that power connections be established before and broken after the data connections. Most USB 2.0 connections achieve this by having electrical contacts of varying lengths, with the data contacts being shorter than the power contacts. This particular embodiment of the present invention mechanically emulates this structure by shortening the pins 501, 502 for the USB DP and USB DN connections so that they are shorter than the pins 500, 503 for the USB +5 V DC and USB 5 V Return connection. Thus, unlike conventional electrical connectors of this type, the connector 103' will establish power connections before and break power connections after the data connections. In the illustrated embodiment, the length $L_1$ for the pins 500, 503 is 8.81 mm and the length $L_2$ for the pins 501, 502 is 7.61 mm.

Furthermore, the twisted pair cable 510 connection between the data signal pins 500–503 and the electronic component 109' is designed with a controlled impedance that matches that of the USB transmitter/receiver to minimize "reflections" which interfere with high data rate transfers. The USB 2.0 standard permits the detection of error rates, to which such reflections contribute, so that transmission rates can be slowed. Thus, the twisted pair cable 510 is designed to cabling to minimize the chances of impedance mismatches which would result in performance degradation. The impedance is determined by a number of implementation specific factors, such as the number of twists per inch and the number of strands in the wires of the cable. The twisted pair cable 510 therefore emulates the electrical performance of conventional USB cabling through its design and implementation.

As mentioned above, the component 109' is an electronic assembly including an electronics board 512, a USB controller 513, and a memory device 514. The subassembly comprised of the electronics board 512, USB controller 513, and memory device 514 is affixed to a circular blank 516 by a physical mount 518. The circular blank 516 is sized to fit with the backshell canister 106, not shown in FIG. 5A–FIG. 5B, and stabilizes the component 109' within the backshell canister 106 during assembly until the encapsulating material is inserted. The electronic assembly also includes a header board 520 that permits electrical contact between the wires of the electrical connection 115' and the subassembly of the electronics board 512, USB controller 513, and memory device 514.

Thus, in this particular embodiment, the invention provides an industrialized/militarized USB solid-state, mass storage drive. The unique packaging and component choice make it the only USB drive capable of surviving military or harsh environment extremes, including temperature, shock, vibration, submersion, EMI, and nuclear. It does all this while retaining the "hot pluggable" feature of standard USB devices, without the fragility of a typical USB Type A connector.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
a rugged electrical connector supporting an Universal Serial Bus external bus protocol including a plurality of power signals and a plurality of data signals and including a plurality of pins mechanically emulating a plurality of Universal Serial Bus contacts;
a backshell canister mated to the electrical connector;

a memory device housed in the canister; and an electrical connection between the memory device and the rugged electrical connector.

2. The apparatus of claim 1, wherein the rugged electrical connector comprises a cylindrical electrical connector.

3. The apparatus of claim 1, wherein the rugged electrical connector is at least one of self aligning, keyed, and scoop-proof.

4. The apparatus of claim 1, further comprising means for stabilizing the memory device in the backshell canister.

5. An apparatus, comprising:

a rugged electrical connector supporting an external bus protocol including a power signal;

a backshell canister mated to the electrical connector;

a memory device housed in the canister; and an electrical connection between the active electronic component and the rugged electrical connector, the electrical connection including a twisted pair cable emulating the electrical performance of an Universal Serial Bus cable for the transmission of data.

6. The apparatus of claim 5, wherein at least one of the rugged electrical connector and the backshell canister is environmentally resistant.

7. The apparatus of claim 5, wherein the rugged electrical connector is at least one of self aligning, keyed, and scoop-proof.

8. The apparatus of claim 5, wherein the external bus protocol comprises an open standard protocol.

9. The apparatus of claim 5, further comprising means for stabilizing the active electronic component in the backshell canister.

10. An apparatus, comprising:

a rugged electrical connector supporting an external bus protocol including a power signal, the connector including pins mechanically emulating Universal Serial Bus contacts;

a backshell canister mated to the electrical connector;

a memory device housed in the canister; and an electrical connection between the active electronic component and the rugged electrical connector.

11. The apparatus of claim 10, wherein at least one of the rugged electrical connector and the backshell canister is environmentally resistant.

12. The apparatus of claim 10, wherein the rugged electrical connector is at least one of self aligning, keyed, and scoop-proof.

13. The apparatus of claim 10, wherein the external bus protocol comprises an open standard protocol.

14. The apparatus of claim 10, further comprising means for stabilizing the active electronic component in the backshell canister.

15. A removable mass storage device, comprising:

a circular rugged electrical connector supporting an external bus protocol including a power signal;

a backshell canister mated to the circular electrical connector;

a memory device housed in the canister;

an electrical connection between the memory device and the circular electrical connector, wherein the electrical connection between the memory device and the circular electrical connector includes a twisted pair cable emulating the electrical performance of an Universal Serial Bus cable for the transmission of data; and means for stabilizing the memory device within the canister.

16. The removable mass storage device of claim 15, wherein at least one of the circular electrical connector and the backshell canister is environmentally resistant.

17. The removable mass storage device of claim 15, wherein the circular electrical connector is at least one of self-aligning, keyed, and scoop-proof.

18. The removable mass storage device of claim 15, wherein the external bus protocol comprises an open standard protocol.

19. A removable mass storage device, comprising:

a circular rugged electrical connector supporting an external bus protocol including a power signal, the circular electrical connector including pins mechanically emulating Universal Serial Bus contacts;

a backshell canister mated to the circular electrical connector;

a memory device housed in the canister;

an electrical connection between the memory device and the circular electrical connector; and means for stabilizing the memory device within the canister.

20. The removable mass storage device of claim 19, wherein at least one of the circular electrical connector and the backshell canister is environmentally resistant.

21. The removable mass storage device of claim 19, wherein the circular electrical connector is at least one of self-aligning, keyed, and scoop-proof.

22. The removable mass storage device of claim 19, wherein the external bus protocol comprises an open standard protocol.

23. A removable mass storage device, comprising:

a circular rugged electrical connector supporting an external bus protocol including a power signal, wherein the electrical connector supports a Universal Serial Bus 2.0 protocol;

a backshell canister mated to the circular electrical connector;

a memory device housed in the canister;

an electrical connection between the memory device and the circular electrical connector; and means for stabilizing the memory device within the canister.

24. The removable mass storage device of claim 23, wherein at least one of the circular electrical connector and the backshell canister is environmentally resistant.

25. The removable mass storage device of claim 23, wherein the circular electrical connector is at least one of self-aligning, keyed, and scoop-proof.

* * * * *

UNITED STATES PATENT AND TRADEMARK OFFICE
CERTIFICATE OF CORRECTION

| | | |
|---|---|---|
| PATENT NO. | : 7,275,961 B2 | Page 1 of 1 |
| APPLICATION NO. | : 11/365729 | |
| DATED | : October 2, 2007 | |
| INVENTOR(S) | : Vonn A. Zauber and Steven M. Gentry | |

It is certified that error appears in the above-identified patent and that said Letters Patent is hereby corrected as shown below:

Title Page (item 63)
In the Related U.S. Application Data Section of the Patent, please change the filing date to --September 27, 2004--.

Signed and Sealed this

First Day of April, 2008

JON W. DUDAS
*Director of the United States Patent and Trademark Office*